United States Patent
Horiguchi

(10) Patent No.: US 6,316,942 B1
(45) Date of Patent: Nov. 13, 2001

(54) ELECTRICAL POTENTIAL SENSOR

(75) Inventor: Chikahiro Horiguchi, Kusatsu (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/325,232

(22) Filed: Jun. 3, 1999

(30) Foreign Application Priority Data

Jun. 15, 1998 (JP) .................................................. 10-167030

(51) Int. Cl.[7] .............................. G01R 29/12; G01R 5/28
(52) U.S. Cl. ...................... 324/457; 324/458; 324/109; 324/72
(58) Field of Search ................. 324/727, 457, 324/458, 96, 613, 109, 72, 635, 713, 675; 331/65; 399/98, 56

(56) References Cited

U.S. PATENT DOCUMENTS

| | | | |
|---|---|---|---|
| 4,683,436 | * 7/1987 | Suzuki | 324/458 |
| 4,894,607 | * 1/1990 | Kumada | 324/96 |
| 5,262,647 | * 11/1993 | Kumada | 250/351 |
| 5,600,251 | * 2/1997 | Akiyama | 324/613 |
| 5,911,694 | * 6/1999 | Ikeda et al. | 600/587 |
| 5,986,456 | * 11/1999 | Yamashita | 324/457 |

FOREIGN PATENT DOCUMENTS

| | | |
|---|---|---|
| 60-29673 | 2/1985 | (JP) . |
| 5-2865 | 1/1993 | (JP) . |

* cited by examiner

Primary Examiner—Vinh P. Nguyen
Assistant Examiner—Paresh Patel
(74) Attorney, Agent, or Firm—Ostrolenk, Faber, Gerb & Soffen, LLP

(57) ABSTRACT

An electric potential sensor includes a piezoelectric tuning fork provided with a vibrating body of tuning fork type, a driving piezoelectric element provided on a first arm of said vibrating body, and a feedback piezoelectric element provided on a second arm of the vibrating body. A detection electrode is provided on the piezoelectric tuning fork. A signal-processing circuit, which is connected to the detection electrode, detects changes in the electric signal generated in said detection electrode which are attributable to the quantity of charge on the surface of an object to be measured. A self-oscillation circuit has an input end of which is connected to the feedback piezoelectric element and an output end of which is connected to the driving piezoelectric element. A gain control circuit is provided on the self-oscillation circuit. A comparator includes an input end which is connected to the feedback piezoelectric element and an output end which is connected to said gain control circuit.

2 Claims, 3 Drawing Sheets

ELECTRICAL POTENTIAL SENSOR

BACKGROUND OF THE INVENTION

1. Field of the Invention

The present invention relates to an electric potential sensor, and more particularly to an electric potential sensor to detect, in a non-contact manner, the charge on a photosensitive drum of an electrophotographic device such as a photocopy machine.

2. Description of the Related Art

The construction of a conventional oscillation-capacity type electric potential sensor is illustrated in FIG. 3.

An electric potential sensor 100 includes a piezoelectric tuning fork 11 which acts as a mechanical oscillator. The piezoelectric tuning fork 11 includes a vibrating body 11a of tuning fork type formed of a metal such as elinvar, a driving piezoelectric element 11b for driving the vibrating body lia is provided a first arm of the vibrating body 11a, and a feedback piezoelectric element 11c for feeding back the signal to the driving piezoelectric element 11b is provided on a second arm of the vibrating body 11a. A detection electrode 12 is formed on the surface of the second arm of the vibrating body 11a, i.e., on the surface of the second arm of the piezoelectric tuning fork 11, and the piezoelectric tuning fork 11 is arranged so that the detection electrode 12 is arranged opposite to a object 13 to be measured. In FIG. 3, the detection electrode 12 is shown separate from the piezoelectric tuning fork 11 to aid in easy understanding of the figure.

The driving piezoelectric element 11b is connected to an output end of a self-oscillation circuit 15, and the feedback piezoelectric element 11c is connected to an input end of the self-oscillation circuit 15. The detection electrode 12 is connected to a signal-processing circuit 20 comprising an impedance converter 21, an AC amplifier 22, a synchronous detection and smoothing circuit 23, and a DC amplifier 24.

The operation of the electric potential sensor 100 is as follows.

The drive signal is output from an output end of the self-oscillation circuit 15. The drive signal is applied to the driving piezoelectric element 11b to cause the driving piezoelectric element 11b to be distorted and a first arm of the vibrating body 11a to be vibrated.

Due to the vibration of the first arm and the tuning fork shape of the vibrating body 11a, a vibration having an opposite phase to that of first arm is generated in the second arm of the vibrating body 11a. The vibration of the second arm of the vibrating body 11a causes the feedback piezoelectric element 11c to be distorted. A feedback signal is therefore generated from the feedback piezoelectric element 11c and the piezoelectric tuning fork 11 is self-oscillated by the application of the feedback signal to the input end of the self-oscillation circuit 15.

The object 13 to be measured is charged to the electric potential $V_{HV}$, and an electric field E is generated between the object 13 measured and the detection electrode 12. When the piezoelectric tuning fork 11 is caused to vibrate, the distance between the detection electrode 12 formed on the piezoelectric tuning fork 11 and the object 13 fluctuates periodically and the electrostatic capacitance generated between the detection electrode 12 and the object 13 is changed periodically. This induces a charge at the detection electrode 12, thereby generating an AC signal. Because the AC signal is proportional to the electric potential $V_{HV}$ of the object 13, the detection output signal corresponding to the electric potential $V_{HV}$ of the object 13 can be obtained by applying the AC signal in the signal-processing circuit 20.

The above-mentioned conventional electric potential sensor has a problem that it is difficult to correctly measure the charged electric potential of the object to be measured. This is because the amplitude of the vibration of the piezoelectric tuning fork is changed due to the temperature characteristic of the piezoelectric tuning fork, the vibration leakage from a support member to support the piezoelectric tuning fork, etc., with the result that the output signal of the electric potential sensor is not stable.

An electric potential sensor of oscillation-capacity type designed to solve this problem is disclosed in Japanese Unexamined Patent Publication No. 60-29673. The electric potential sensor detects the amplitude of the piezoelectric tuning fork using a photosensor and maintains the amplitude of the piezoelectric tuning fork to be constant accordingly. However, since the electric potential sensor requires a photosensor, a new problem is raised that the wiring in the vicinity of the piezoelectric tuning fork becomes complicated.

Another electric potential sensor intended to solve the above-mentioned problem includes an electric potential sensor of chopper type disclosed in Japanese Examined Utility Model Publication No. 5-2865. This electric potential sensor eliminates the signal attributable to the amplitude of the piezoelectric tuning fork from the output electric potential by dividing the output voltage of the electric potential sensor and the output voltage of the chopper part.

However, the sensitivity of the detection signal is degraded because the output voltage is divided. Further, because the output voltage of the electric potential sensor and the output voltage of the chopper part both include noise, the noise components are not eliminated even through the division and, indeed, are further increased through the division. In addition, a new problem is raised that the S/N ratio of the detection signal is reduced.

SUMMARY OF THE INVENTION

An electric potential sensor of the present invention can solve the aforementioned problems associated with the conventional electric potential sensors and generates a stable output signal by stabilizing the vibrator amplitude of the piezoelectric tuning fork. It is also free from degradation of the S/N ratio and has a simple structure.

The electric potential sensor according to one embodiment of the present invention comprises an piezoelectric tuning fork provided with a vibrating body of tuning fork type, a drive piezoelectric element provided on a first arm of the vibrating body, and a feedback piezoelectric element provided on the second arm of the vibrating body, a detection electrode provided on the piezoelectric tuning fork, a signal-processing circuit connected to the detection electrode and detecting a change in the electric signal generated in the detection electrode as a result of the charge on the surface of a work to be measured, a self-oscillation circuit connected between the feedback piezoelectric element and the drive piezoelectric element, the self-oscillation circuit includes a gain control circuit, and a comparator connected between the feedback piezoelectric element and the gain control circuit.

The electric potential sensor according to another embodiment of the present invention comprises a piezoelectric tuning fork provided with a vibrating body of tuning fork type, a drive piezoelectric element provided on a first arm of the vibrating body, and a feedback piezoelectric element provided on the second arm of the vibrating body, a detection electrode provided on the piezoelectric tuning fork, a signal-processing circuit connected to the detection electrode and detecting a change of the electric signal generated in the detection electrode which is attributable to the charge on the surface of a work to be measured, a gain control circuit provided on the signal-processing circuit, a self-oscillation circuit connected between the feedback piezoelectric element and the drive piezoelectric element, and a comparator connected between the feedback piezoelectric element and the gain control circuit.

According to a preferred embodiment of the present invention, the feedback signal corresponding to the amplitude of the piezoelectric tuning fork is compared with the reference signal by the comparator, the obtained signal through comparison is received by the gain control circuit in the self-oscillation circuit and the gain is controlled, and the amplitude is stabilized while the piezoelectric tuning fork is not affected by the temperature characteristic, the oscillation leakage, etc. of the piezoelectric tuning fork. Thus, the detection signal of the electric potential sensor becomes stable without being affected by the ambient temperature.

Further, the feedback signal corresponding to the amplitude of the piezoelectric tuning fork is preferably compared with the reference signal by the comparator, the obtained signal through comparison is received by the gain control circuit in the signal-processing circuit, the signal to be outputted from the signal-processing circuit, i.e., the output signal of the electric potential sensor is controlled, and even when the piezoelectric tuning fork is affected by the temperature characteristic, the oscillation leakage, etc. of the piezoelectric tuning fork and its amplitude is changed, the detection signal of the electric potential sensor detects the change in amplitude in the signal-processing circuit, and controls the gain according to its fluctuation to control the signal for stabilization, and the detection signal becomes stable without being affected by the ambient temperature.

In addition, the noise level is not increased or no problem is raised that the S/N ratio of the detection signal is reduced.

BRIEF DESCRIPTION OF THE DRAWINGS

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, the preferred embodiments of the present invention are explained in detail with reference to the drawings. The same numbers are given to the same constitution as that indicated in the conventional construction, and its explanation may be partly omitted.

Figure 1:
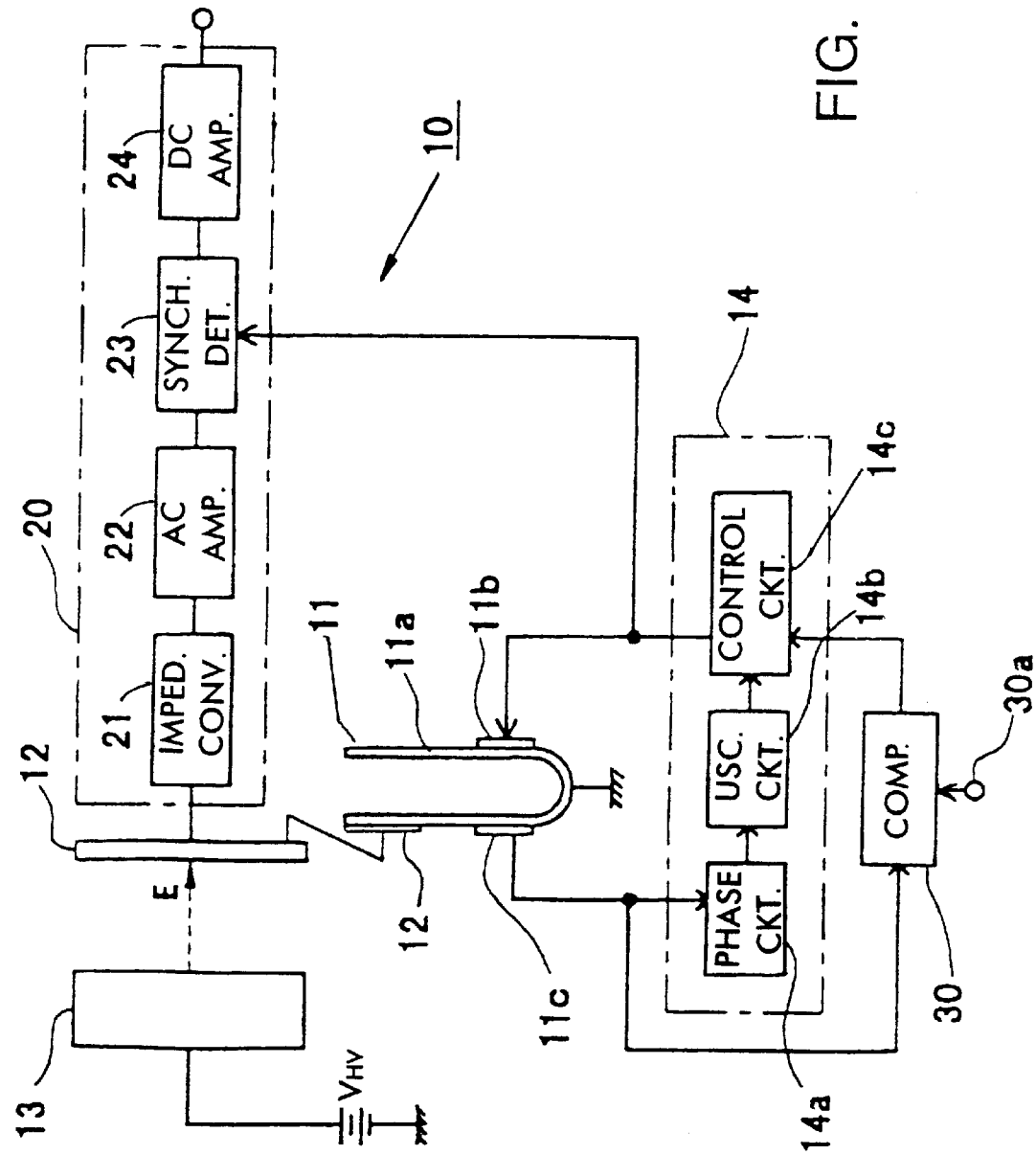
FIG. 1 is a schematic representation of a construction of the electric potential sensor of the first embodiment of the present invention.

FIG. 1 shows a electric potential sensor of a first embodiment of the present invention. A electric potential sensor 10 includes a piezoelectric tuning fork 11 which operates as a mechanical oscillator means. The piezoelectric tuning fork 11 includes a tuning fork type vibrating body 11a formed of metal such as elinvar, a driving piezoelectric element 11b located on a first arm of the vibrating body 11a for driving the vibrating body 11a and a feedback piezoelectric element 11c located on a second arm of the vibrating body 11a. A detection electrode 12 is formed on the surface of the second arm of the vibrating body 11a, i.e., on the surface of the second arm of the piezoelectric tuning fork 11, and the piezoelectric tuning fork 11 is arranged so that the detection electrode 12 is located opposite to an object 13 to be measured. In FIG. 1, the detection electrode 12 is illustrated as being separated from the piezoelectric tuning fork 11 to enhance easy understanding of the figure.

The electric potential sensor 10 further comprises a self-oscillation circuit 14 to self-oscillate the piezoelectric tuning fork 11, a signal-processing circuit 20 to process and detect the electric signal obtained from the piezoelectric tuning fork 11, and a comparator 30 to compare the output signal of the piezoelectric element 11c for feedback arranged in the piezoelectric tuning fork 11 with the reference signal.

The self-oscillation circuit 14 comprises a phase circuit 14a, an oscillation circuit 14b and a gain control circuit 14c. The signal-processing circuit 20 comprises an impedance converter 21, an AC amplifier 22, a synchronous detection and smoothing circuit 23, and a DC amplifier 24.

The connection of the above-mentioned electric potential sensor 10 is as follows.

As indicated in FIG. 1, an input end of the self-oscillation circuit 14, i.e., an input end of the phase circuit 14a, is connected to the feedback piezoelectric element 11c provided on the piezelectric tuning fork 11, an output end of the phase circuit 14a is connected to an input end of the oscillation circuit 14b and an output end of the oscillation circuit 14b, i.e., an output end of the self-oscillation circuit 14, is connected to the driving piezoelectric element 11b provided on the piezoelectric tuning fork to constitute a feedback circuit. The output end of the self-oscillation circuit 14 is connected to the other input end of the synchronous detection and smoothing circuit 23.

An input end of the signal-processing circuit 20, i.e., an input end of the impedance converter 21, is connected to the detection electrode 12, and an output end of the impedance converter 21 is connected to an input end of the AC amplifier 22. An output end of the AC amplifier 22 is connected to one input end of the synchronous detection and smoothing circuit 23, an output end of the synchronous detection and smoothing circuit 23 is connected to an input end of the DC amplifier 24, and an output end of the DC amplifier 24 defines an output end of the signal detection circuit 20.

One input end of the comparator 30 is connected to the feedback piezoelectric element 11c provided on the piezoelectric tuning fork 11, the comparator 30 is provided with a reference signal input end 30a as the other input end, and an output end of the comparator 30 is connected to the other input end of the gain control circuit 14c in the self-oscillation circuit 14.

In the foregoing electric potential sensor 10, the drive signal is output from the output end of the self-oscillation circuit 14 and applied to the piezoelectric element 11b as a drive signal, causing the driving piezoelectric element 11b to be distorted and a first arm of the vibrating body 11a to oscillate.

Due to the vibration of first arm and the tuning fork shape of the vibrating body 11a, the second arm of the vibrating body 11a oscillates with the opposite phase to that of first arm. The oscillation of the second arm of the vibrating body 11a causes the feedback piezoelectric element 11c to be distorted, the feedback signal is generated from the piezoelectric element 11c, and the feedback signal is inputted in the input end of the self-oscillation circuit 14 to self-oscillate the piezoelectric tuning fork 11.

The feedback signal is received by the comparator 30 and compared with the reference signal. The compared signal is applied to the gain control circuit 14c in the self-oscillation circuit 14 to control the signal output from the self-oscillation circuit 14.

The object 13 to be measured is charged to an electric potential $V_{HV}$, and an electric field E is generated between the object 13 and the detection electrode 12. Oscillation of the piezoelectric tuning fork 11 causes the distance between the detection electrode 12 and the object 13 fluctuate periodically, and the electrostatic capacity between the detection electrode 12 and the object 13 is changed periodically by the periodical fluctuation in the distance. A charge is induced in the detection electrode 12 to generate the AC signal. The AC signal is proportional to the electric potential $V_{HV}$ of the object 13. The AC signal is received by the signal-processing circuit 20, impedance-converted by the impedance converter 21, amplified into the AC signal by the AC amplifier 22, synchronously detected and smoothed by the synchronous detection and smoothing circuit 23 with the signal of the self-oscillation circuit 14 as the detection timing, and amplified by the DC amplifier 24 to obtain the detection output signal corresponding to the electric potential $V_{HV}$ of the object 13.

In the electric potential sensor 10, the feedback signal corresponding to the amplitude of the piezoelectric tuning fork 11 is compared with the reference signal by the comparator 30. The resulting signal (obtained through comparison) is received by the gain control circuit 14c in the self-oscillation circuit 14, and the gain is controlled to stabilize the amplitude so that the piezoelectric tuning fork 11 is unaffected by the temperature characteristic, the oscillation leakage, etc., of the piezoelectric tuning fork 11. Thus, the detection signal of the electric potential sensor 10 is stabilized without being affected by the ambient temperature. Further, the S/N ratio is not reduced as it is in the prior art described above.

Figure 2:
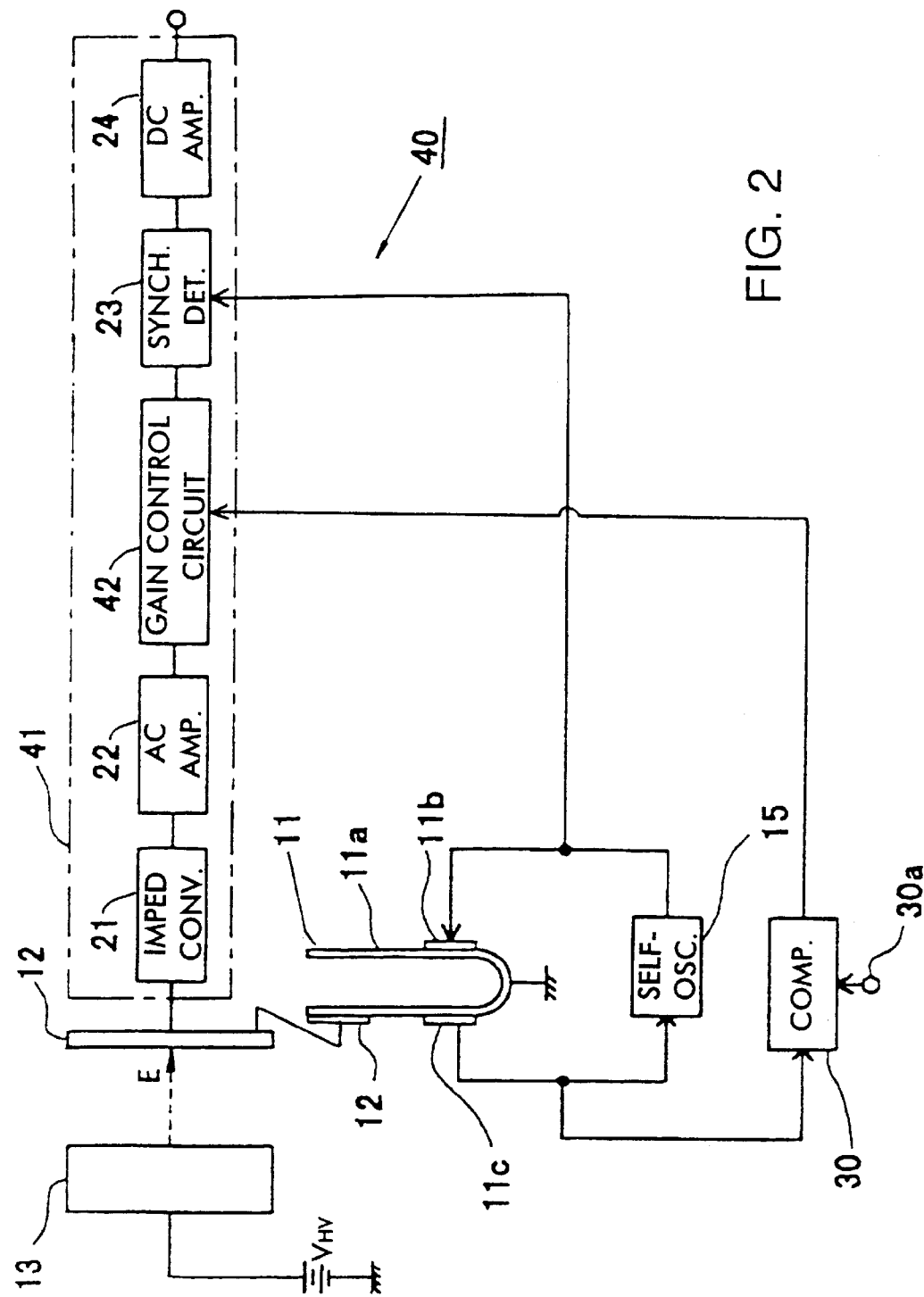
FIG. 2 is a schematic representation of a construction of the electric potential sensor of the second embodiment of the present invention.
Figure 3:
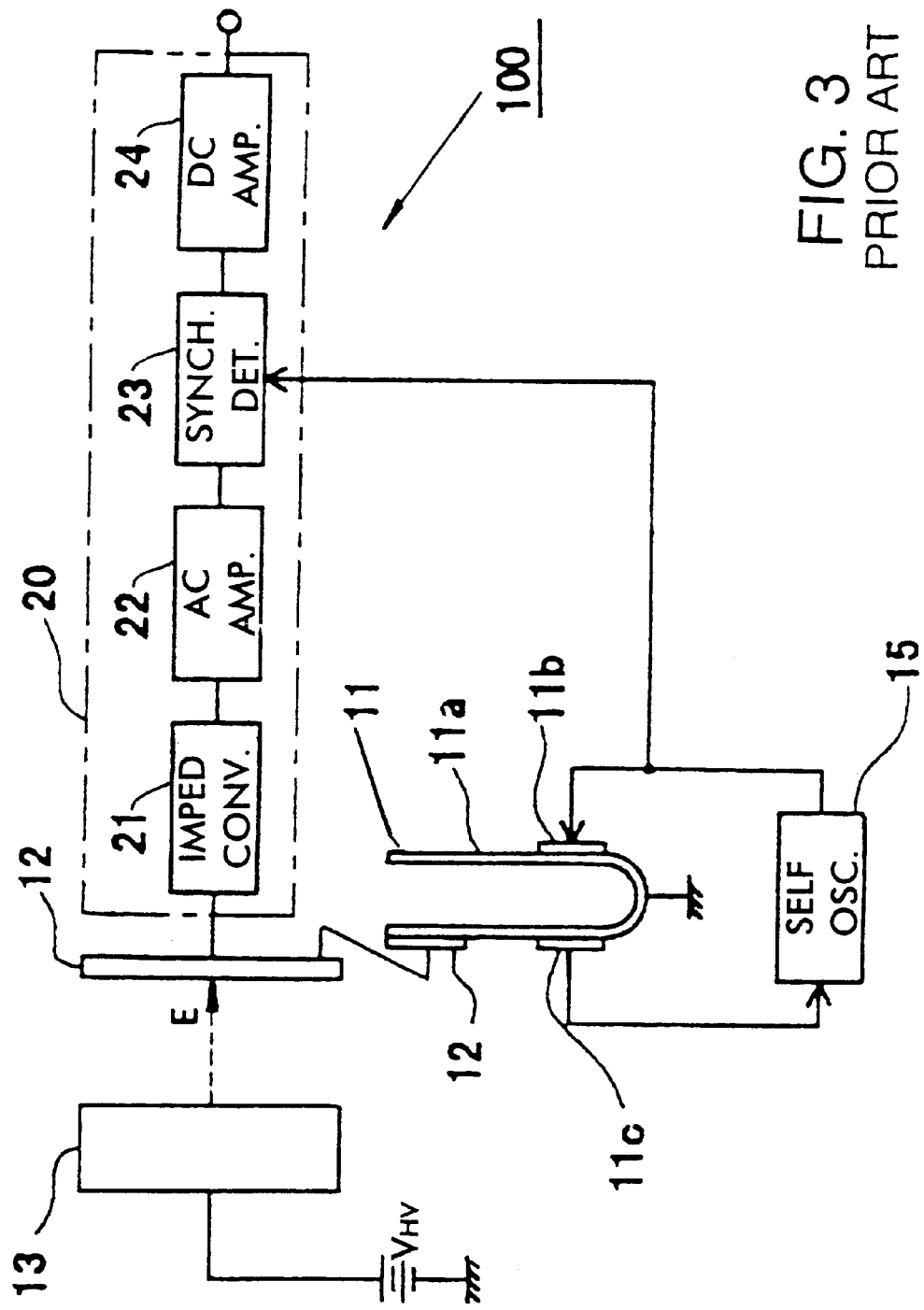
FIG. 3 is a schematic representation of a conventional electric potential sensor.

The electric potential sensor of a second embodiment of the present invention is illustrated in FIG. 2. The same number is given to the same construction as that of the electric potential sensor 100 in the conventional example and the electric potential sensor 10 illustrated in the first embodiment, and its explanation is omitted.

A circuit block of a electric potential sensor 40 comprises a self-oscillation circuit 15 to self-oscillate the piezoelectric tuning fork 11, a signal-processing circuit 41 to process and detect the electric signal to be obtained from the piezoelectric tuning fork, and a comparator 30 to compare the output signal of the feedback piezoelectric element 11c arranged in the piezoelectric tuning fork 11 with the reference signal.

The signal-processing circuit 41 comprises an impedance converter 21, an AC amplifier 22, a gain control circuit 42, a synchronous detection and smoothing circuit 23 and a DC amplifier 24.

The connection of the electric potential sensor 40 is as follows.

As illustrated in FIG. 2, an input end of the self-oscillation circuit 15 is connected to the feedback piezoelectric element 11c provided on the piezoelectric tuning fork 11, and an output end of the self-oscillation circuit 15 is connected to the driving piezoelectric element 11b provided on the piezoelectric tuning fork to form a feedback circuit. An output end of the self-oscillation circuit 15 is connected to the other input end of the synchronous detection and smoothing circuit 23.

An input end of the signal-processing circuit 41, i.e., an input end of the impedance converter 21, is connected to the detection electrode 12, while an output end of the impedance converter 21 is connected to an input end of the AC amplifier 22. An output end of the AC amplifier 22 is connected to one input end of the gain control circuit 42, an output end of the gain control circuit 42 is connected to one input end of the synchronous detection and smoothing circuit 23, an output end of the synchronous detection and smoothing circuit 23 is connected to an input end of the DC amplifier 24, and an output end of the DC amplifier 24 defines an output end of the signal detection circuit 41.

One input end of the comparator 30 is connected to the feedback piezoelectric element 11c provided on the piezoelectric tuning fork 11, the comparator 30 is provided with a reference signal input end 30a as the other input end, and an output end of the comparator 30 is connected to the other input end of the gain control circuit 42 in the signal-processing circuit 41.

The difference between the operation of the electric potential sensor 40 of the second embodiment and the operation of the electric potential sensor 10 of the first embodiment is as follows.

The feedback signal generated from the feedback piezoelectric element 11c is inputted in the input end of the self-oscillation circuit 15 and received by the comparator 30, the feedback signal corresponding to the amplitude of the piezoelectric tuning fork 11 is compared with the reference signal, and the signal obtained through comparison is applied to the gain control circuit 42 in the signal-processing circuit 41 to control the signal to be outputted from the signal-processing circuit 41, i.e., the output signal of the electric potential sensor 40. Thus, even if the piezoelectric tuning fork 11 is affected by its temperature characteristic, oscillation leakage, etc. and its amplitude of vibration is changed, the detection signal of the electric potential sensor 40 detects the change in amplitude in the signal-processing circuit 41 and controls the gain corresponding to the fluctuation to control the signal so as to be stable, and the stable detection signal is obtained without being affected by ambient temperature. In addition, the S/N ratio is not reduced like the prior art discussed above.

In the above-mentioned electric potential sensor of the embodiment of the present invention, an explanation is made with the electric potential sensor of oscillationcapacity type as an example, but it goes without saying that the present invention is also applicable to the electric potential sensor of chopper type.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. An electric potential sensor, comprising:
   a piezoelectric tuning fork provided with a vibrating body of tuning fork type, a driving piezoelectric element provided on a first arm of said vibrating body, and a feedback piezoelectric element provided on a second arm of said vibrating body;

a detection electrode provided on said piezoelectric tuning fork;

a signal-processing circuit connected to said detection electrode which detects the change in the electric signal generated in said detection electrode which is attributable to the charge on the surface of an object to be measured;

a comparator receiving a feedback signal from said feedback piezoelectric element and outputting a signal obtained by comparing said feedback signal to a reference signal; and a self-oscillation circuit connected between said feedback piezoelectric element and said driving piezoelectric element and receiving said feedback signal and outputting a driving signal to said driving piezoelectric element, said self-oscillation circuit including a gain control circuit which receives said signal from said comparator and controls an amplitude of said driving signal.

2. An electric potential sensor comprising:

a piezoelectric tuning fork provided with a vibrating body of tuning fork type, a driving piezoelectric element provided on a first arm of said vibrating body, and a feedback piezoelectric element provided on a second arm of said vibrating body;

a detection electrode provided on said piezoelectric tuning fork;

a comparator receiving a feedback signal from said feedback piezoelectric element and outputting a signal obtained by comparing said feedback signal to a reference signal;

a signal-processing circuit connected to said detection electrode and outputting a detection signal by detecting change in the electric signal generated in said detection electrode which is attributable to the charge on the surface of an object to be measured, said signal-processing circuit including a gain control circuit which receives said signal from said comparator and controls an amplitude of said detection signal;

a self-oscillation circuit connected between said feedback piezoelectric element and said driving piezoelectric element.

* * * * *